(12) United States Patent
Kang

(10) Patent No.: US 10,483,908 B2
(45) Date of Patent: Nov. 19, 2019

(54) WEARABLE POWER MANAGEMENT SYSTEM

(71) Applicant: Man Qing Kang, Shenzhen (CN)

(72) Inventor: Man Qing Kang, Shenzhen (CN)

(73) Assignee: SHENZHEN DANSHA TECHNOLOGY CO., LTD., Shenzhen, Guangdong (CN)

( * ) Notice: Subject to any disclaimer, the term of this patent is extended or adjusted under 35 U.S.C. 154(b) by 50 days.

(21) Appl. No.: 15/603,450

(22) Filed: May 24, 2017

(65) Prior Publication Data

US 2017/0257060 A1    Sep. 7, 2017

(51) Int. Cl.

| | | |
|---|---|---|
| *H01L 31/044* | (2014.01) | |
| *H02S 40/38* | (2014.01) | |
| *H01L 31/05* | (2014.01) | |
| *H01L 31/048* | (2014.01) | |
| *H01M 10/0525* | (2010.01) | |
| *H01M 10/46* | (2006.01) | |
| *H01M 2/20* | (2006.01) | |
| *H01M 16/00* | (2006.01) | |
| *H01L 31/042* | (2014.01) | |
| *H01L 31/053* | (2014.01) | |

(52) U.S. Cl.
CPC ............ *H02S 40/38* (2014.12); *H01L 31/042* (2013.01); *H01L 31/048* (2013.01); *H01L 31/0481* (2013.01); *H01L 31/053* (2014.12); *H01L 31/0508* (2013.01); *H01L 31/0512* (2013.01); *H01M 2/204* (2013.01); *H01M 10/0525* (2013.01); *H01M 10/465* (2013.01); *H01M 16/00* (2013.01); *H01M 2220/30* (2013.01); *Y02E 60/122* (2013.01)

(58) Field of Classification Search
CPC ...... H01L 31/00–078; Y02E 10/50–60; H01M 10/00–60; H02S 30/00–20; H02S 99/00; H02S 40/00–44
USPC .................. 136/243–265; 429/1–11, 47–255
See application file for complete search history.

(56) References Cited

U.S. PATENT DOCUMENTS

| | | | |
|---|---|---|---|
| 2009/0072780 A1* | 3/2009 | Lee ....................... | H01L 31/04 320/101 |
| 2010/0229923 A1* | 9/2010 | Frolov ................ | H01L 31/0392 136/251 |
| 2012/0300440 A1* | 11/2012 | Miyamae ............ | H01M 10/465 362/183 |
| 2014/0124014 A1* | 5/2014 | Morad .................. | H01L 31/042 136/246 |
| 2014/0318602 A1* | 10/2014 | Black ................ | H01L 31/02013 136/251 |

(Continued)

FOREIGN PATENT DOCUMENTS

WO    WO2013112883    *    8/2013

*Primary Examiner* — Bach T Dinh

(57) ABSTRACT

A wearable power management system includes: a bottom coating layer; a bottom center layer disposed above the bottom coating layer; a circuit layer disposed above the bottom center layer; a top center layer disposed above the circuit layer, and a top coating layer disposed above the top center layer. The bottom center layer and the top center layer are made of an ultra-low Young's modulus material. The Young's modulus of the bottom coating layer and the top coating layer is greater than the Young's modulus of the bottom center layer and the top center layer. The circuit layer includes a device layer and a connection layer disposed above the device layer.

19 Claims, 4 Drawing Sheets

(56) References Cited

U.S. PATENT DOCUMENTS

2014/0367644 A1* 12/2014 Song .................. H01L 51/0097
257/40
2015/0287860 A1* 10/2015 Tsukada ............. H01L 31/0481
136/251
2016/0218327 A1* 7/2016 Takahashi .......... H01M 2/0275

* cited by examiner

WEARABLE POWER MANAGEMENT SYSTEM

FIELD OF THE PATENT APPLICATION

The present patent application generally relates to wearable electronics and more specifically to a wearable power management system.

BACKGROUND

A power supply system, or a power management system, is an indispensable part of a wearable electronic system. Because the wearable electronic system often needs to contact the skin, the power management system thereof is generally required to be light, thin, soft, and having good flexibility, good ductility, operational stability and long service lifetime. Conventional wearable electronic systems usually employ wireless power supply methods, through high frequency radio frequency (RF) signals, transmitting electric power from the outside to the wearable electronic system on the body of a user. While this method is easy to implement, it is not applicable to many application scenarios. Therefore, it is desired to provide a wearable power management system that does not require external power supply, has wide applications, and satisfies the above requirements.

SUMMARY

The present patent application is directed to a wearable power management system. In one aspect, a wearable power management system includes a bottom coating layer; a bottom center layer disposed above the bottom coating layer; a circuit layer disposed above the bottom center layer; a top center layer disposed above the circuit layer; and a top coating layer disposed above the top center layer. The Young's modulus of both the bottom center layer and the top center layer is in the range of 2.5 kPa-4.5 kPa and the thickness of both the bottom center layer and the top center layer is in the range of 250 um-350 um. The Young's modulus of both the bottom coating layer and the top coating layer is in the range of 50 kPa-70 kPa and the thickness of both the bottom coating layer and the top coating layer is in the range of 250 um-350 um. The circuit layer includes a device layer and a connection layer disposed above the device layer. The device layer includes a device matrix and alloy connection wires, the device matrix including a plurality of cells and a plurality of rechargeable batteries. Odd rows of the device matrix include a plurality of solar cells. Even rows of the device matrix comprise a plurality of rechargeable batteries. The solar cells are composite semiconductor solar cells with thickness between 30 um-40 um. The rechargeable batteries are lithium-ion chip cells with thickness between 180 um-220 um. The alloy connection wires are connected and conducting between the device layer and the connection layer, and made of indium silver alloy. The connection layer includes a connection wire network, the connection wire network including a plurality of connection wires and overlapping with the device matrix. Each device in the device matrix is connected to an adjacent device in the device matrix through the alloy connection wires and the connection wires of the connection network. The connection wires essentially have a shape of sine waveforms. The connection layer includes a first polyimide layer, a copper layer disposed above the first polyimide layer, and a second polyimide layer disposed above the copper layer.

In another aspect, a wearable power management system includes a bottom coating layer; a bottom center layer disposed above the bottom coating layer; a circuit layer disposed above the bottom center layer; a top center layer disposed above the circuit layer, and a top coating layer disposed above the top center layer. The bottom center layer and the top center layer may be made of an ultra-low Young's modulus material. The Young's modulus of the bottom coating layer and the top coating layer is greater than the Young's modulus of the bottom center layer and the top center layer. The circuit layer includes a device layer and a connection layer disposed above the device layer. The device layer includes a device matrix, the device matrix including a plurality of solar cells and a plurality of rechargeable batteries. The connection layer includes a connection wire network. The connection wire network includes a plurality of connection wires and overlapping with the device matrix. Each device in the device matrix is connected to an adjacent device in the device matrix through the connection wires of the connection network.

The Young's modulus of both the bottom center layer and the top center layer may be in the range of 2.5 kPa-4.5 kPa and the thickness of both the bottom center layer and the top center layer may be in the range of 250 um-350 um.

The Young's modulus of both the bottom coating layer and the top coating layer may be in the range of 50 kPa-70 kPa and the thickness of both the bottom coating layer and the top coating layer may be in the range of 250 um-350 um.

The device layer may include alloy connection wires connecting and conducting the device layer and the connection layer, and being made of indium silver alloy.

Odd rows of the device matrix may include a plurality of solar cells, while even rows of the device matrix may include a plurality of rechargeable batteries.

The solar cells may be composite semiconductor solar cells with thickness between 30 um-40 um, while the rechargeable batteries may be lithium-ion chip cells with thickness between 180 um-220 um.

The connection wires essentially may have a shape of sine waveforms. The connection layer may include a first polyimide layer, a copper layer disposed above the first polyimide layer, and a second polyimide layer disposed above the copper layer.

In yet another aspect, the wearable power management system includes a bottom coating layer; a bottom center layer disposed above the bottom coating layer; a circuit layer disposed above the bottom center layer; a top center layer disposed above the circuit layer, and a top coating layer disposed above the top center layer. The bottom center layer and the top center layer are made of an ultra-low Young's modulus material. The Young's modulus of the bottom coating layer and the top coating layer is greater than the Young's modulus of the bottom center layer and the top center layer, and the circuit layer includes a device layer and a connection layer disposed above the device layer.

The device layer may include a device matrix, the device matrix may include a plurality of solar cells and a plurality of rechargeable batteries.

The connection layer may include a connection wire network, the connection wire network may include many connection wires and overlap with the device matrix.

Each device in the device matrix may be connected to an adjacent device in the device matrix through the connection wires of the connection network. The Young's modulus of both the bottom center layer and the top center layer may be in the range of 2.5 kPa-4.5 kPa and the thickness of both the bottom center layer and the top center layer may be in the range of 250 um-350 um. The Young's modulus of both the bottom coating layer and the top coating layer may be in the range of 50 kPa-70 kPa and the thickness of both the bottom coating layer and the top coating layer may be in the range of 250 um-350 um.

The device layer may include alloy connection wires connecting and conducting the device layer and the connection layer. Odd rows of the device matrix may include a plurality of solar cells, while even rows of the device matrix may include a plurality of rechargeable batteries.

The solar cells may be composite semiconductor solar cells with thickness between 30 um-40 um, while the rechargeable batteries may be lithium-ion chip cells with thickness between 180 um-220 um. The connection wires essentially may have a shape of sine waveforms.

The connection layer may include a first polyimide layer, a copper layer disposed above the first polyimide layer, and a second polyimide layer disposed above the copper layer. The alloy connection wires may be made of indium silver alloy.

The Young's modulus of both the bottom center layer and the top center layer maybe may be in the range of 2.5 kPa-4.5 kPa and the thickness of both the bottom center layer and the top center layer may be in the range of 250 um-350 um. The Young's modulus of both the bottom coating layer and the top coating layer may be in the range of 50 kPa-70 kPa and the thickness of both the bottom coating layer and the top coating layer may be in the range of 250 um-350 um.

DETAILED DESCRIPTION

Reference will now be made in detail to a preferred embodiment of the wearable power management system disclosed in the present patent application, examples of which are also provided in the following description. Exemplary embodiments of the wearable power management system disclosed in the present patent application are described in detail, although it will be apparent to those skilled in the relevant art that some features that are not particularly important to an understanding of the wearable power management system may not be shown for the sake of clarity.

Furthermore, it should be understood that the wearable power management system disclosed in the present patent application is not limited to the precise embodiments described below and that various changes and modifications thereof may be effected by one skilled in the art without departing from the spirit or scope of the protection. For example, devices and/or features of different illustrative embodiments may be combined with each other and/or substituted for each other within the scope of this disclosure.

Figure 1:
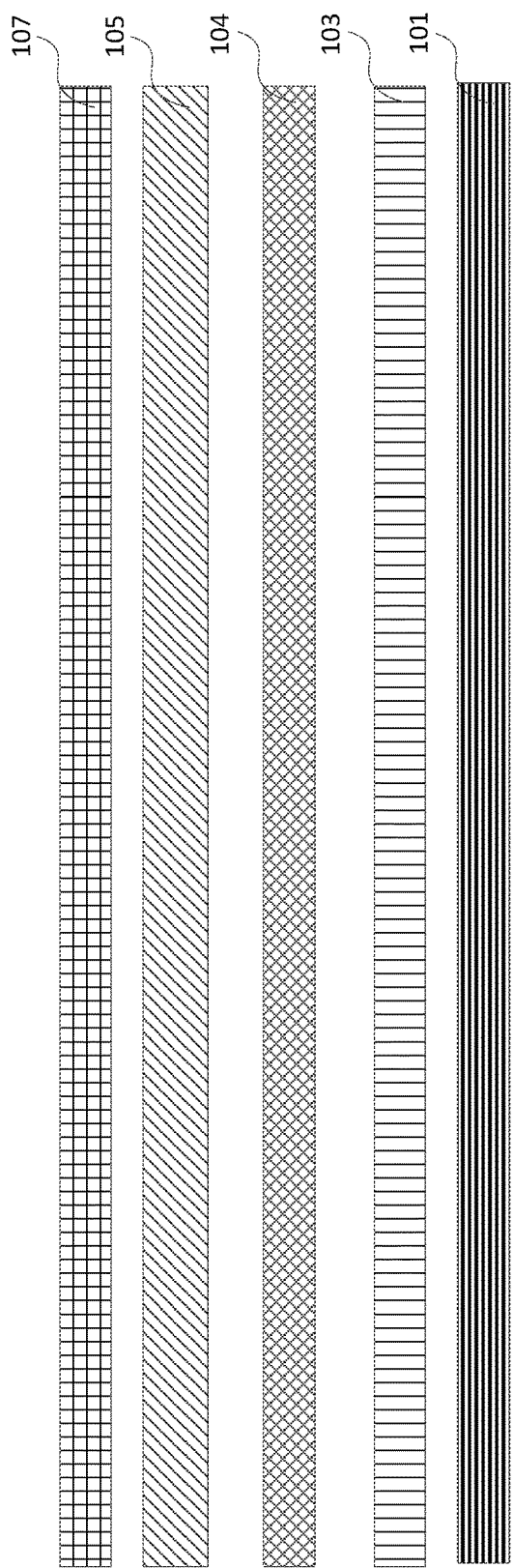
FIG. 1 is a cross-sectional diagram a wearable power management system in accordance with an embodiment of the present patent application.

FIG. 1 is a cross-sectional diagram of a wearable power management system in accordance with an embodiment of the present patent application. Referring to FIG. 1, the wearable power management system includes a bottom coating layer 101; a bottom center layer 103 disposed above the bottom coating layer 101; a circuit layer 104 disposed above the bottom center layer 103; a top center layer 105 disposed above the circuit layer 104; and a top coating layer 107 disposed above top center layer 105. The bottom center layer 103 and the top center layer 105 are made of an ultra-low Young's modulus material. In this embodiment, the Young's modulus of the material is in the range of 2.5 kPa-4.5 kPa. The thickness of both the bottom center layer and the top center layer is in the range of 250 um-350 um. Such configuration enables the circuit layer 104 to move freely in the bottom center 103 and the top center layer 105 so as to avoid being damaged under an external force, because the bottom center layer 103 and the top center layer 105 have relatively good elasticity and ductility. The Young's modulus of the bottom coating layer 101 and the top coating layer 107 is greater than the Young's modulus of the bottom center layer 103 and the top center layer 105. In this embodiment, the Young's modulus of both the bottom coating layer and the top coating layer is in the range of 50 kPa-70 kPa and the thickness of both the bottom coating layer and the top coating layer is in the range of 250 um-350 um. Such configuration makes the bottom coating layer 101 and the top coating layer 107 having a certain strength, so as to protect the bottom center layer 103, the top center layer 105 and the circuit layer 104, so that the wearable power management system can work properly in an environment where there are various types of external force.

Figure 2:
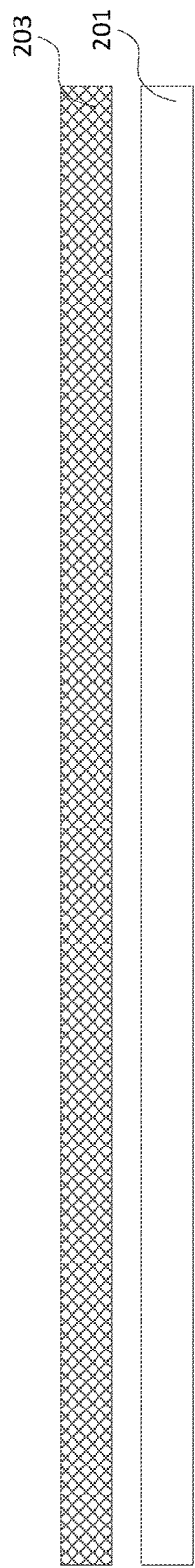
FIG. 2 is a cross-sectional diagram of a circuit layer of the wearable power management system as depicted in FIG. 1.
Figure 3:
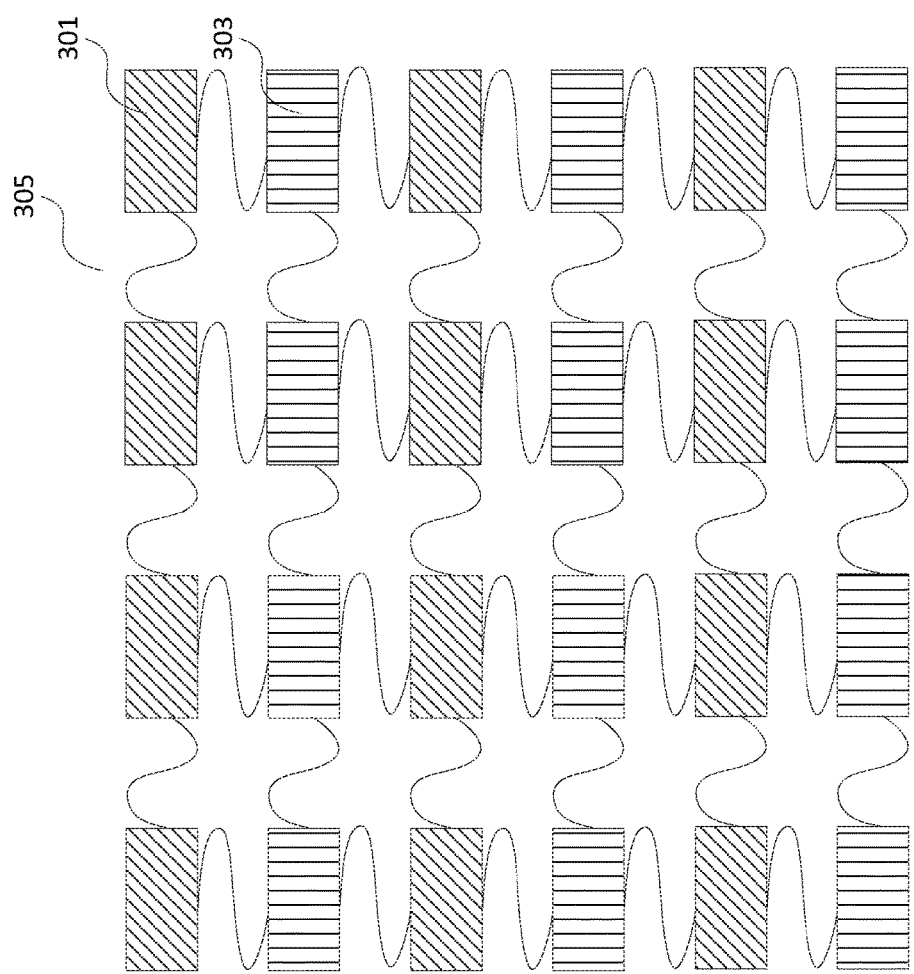
FIG. 3 is a top view of the circuit layer as depicted in FIG. 2.

FIG. 2 is a cross-sectional diagram of the circuit layer 104 of the wearable power management system as depicted in FIG. 1. Referring to FIG. 2, the circuit layer 104 includes a device layer 201; and a connection layer 203 disposed above the device layer 203. FIG. 3 is a top view of the circuit layer 104 as depicted in FIG. 2. Referring to FIG. 2 and FIG. 3, the device layer 201 includes a device matrix, which includes multiple solar cells and multiple rechargeable batteries. In this embodiment, odd rows of the device matrix includes multiple solar cells 301, while even rows of the device matrix includes multiple rechargeable batteries 303. Preferably, the solar cells 301 are composite semiconductor solar cells with thickness between 30 um-40 um. The rechargeable batteries 303 are lithium-ion chip cells with thickness between 180 um-220 um. The device layer 201 further includes multiple alloy connection wires (not shown in FIG. 3). The alloy connection wires are connected and conducting between the device layer 201 and the connection layer 203. In this embodiment, the alloy connection wires are made of indium silver alloy, and therefore having relatively good conductivity and ductility. The device matrix structure as described above has a strong fault-tolerant capability. Even if one device is damaged and stops working properly, other devices of the system can continue to work, and therefore the stability of the wearable power management system is relatively high.

Referring to FIG. 2 and FIG. 3, the connection layer 203 includes a connection wire network. The connection wire network includes multiple connection wires 305 and overlaps with the device matrix. Each device in the device matrix is connected to an adjacent device in the device matrix through the alloy connection wires and the connection wires 305 of the connection network. The connection wires essentially have a shape of sine waveforms, so as to maintain a certain flexible ductility. The shape of sine waveforms is similar to the antenna of insects. Such a bionic design can greatly relieve the impact that the connection wire 305 receives under an external force, and thereby further enhance the stability of the system.

Figure 4:
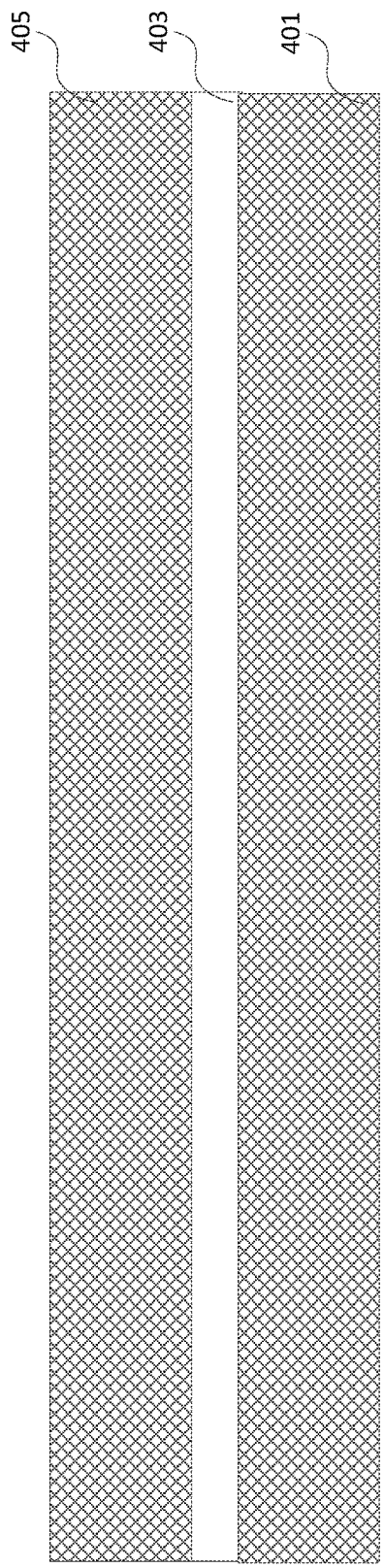
FIG. 4 is a cross-sectional diagram of a connection layer of the circuit layer as depicted in FIG. 2.

FIG. 4 is a cross-sectional diagram of the connection layer 203 of the circuit layer as depicted in FIG. 2. Referring to FIG. v2 and FIG. 4, the connection layer 203 includes a first polyimide layer 401; a copper layer 403 disposed above the first polyimide layer 401; and a second polyimide layer 405 disposed above copper product layer 403. Because the density of the first polyimide layer 401 and the second polyimide layer 405 are relatively low, they are relatively light weight. In addition, they not only have relatively good elasticity and ductility, but also can provide a certain extent of strength. As a result, by their protection, the copper layer disposed between them can provide electrical connections continuously and stably under an external force.

While the wearable power management system is working, the solar cells 301 transform light energy into electrical energy when light is sufficient and charge the rechargeable batteries 303, while the rechargeable batteries 303 are providing electric power to the wearable power management system.

In this embodiment, as a result of employing the multilayer structure as shown in FIG. 1, the circuit layer 104 can move freely in the bottom center 103 and the top center layer 105, which have super low Young's modulus, so as to avoid being damaged, while at the same time obtaining a certain degree of protection provided by the bottom coating layer 101 and the top coating layer 107, which have a relatively high Young's modulus. The device matrix structure as shown in FIG. 3 has a strong fault-tolerant capability. Even if one device is damaged and stops working properly, other devices of the system can continue to work, and therefore the stability of the wearable power management system is relatively high. In the meanwhile, the connection wires 305 of the connection layer 205 essentially have a shape of sine waveforms, which is similar to the antenna of insects. Such a bionic design can greatly relieve the impact that the connection wire 305 receives under an external force, and thereby further enhance the stability of the system. The multilayer structure of the connection layer 203 as shown in FIG. 4 not only has light weight and relatively good elasticity and ductility, but also can provide a certain extent of strength, so that the copper layer disposed between the first polyimide layer 401 and the second polyimide layer 405 can provide electrical connections continuously and stably under an external force. Therefore, the wearable power management system provided in the above embodiment not only does not require any external power supply, therefore satisfying the requirements of the application over a wide range, but also is light, thin, soft, having good flexibility and work stability and long service life.

While the present patent application has been shown and described with particular references to a number of embodiments thereof, it should be noted that various other changes or modifications may be made without departing from the scope of the present invention.

What is claimed is:

1. A wearable power management system comprising:
a bottom coating layer;
a bottom center layer disposed above the bottom coating layer;
a circuit layer disposed above the bottom center layer;
a top center layer disposed above the circuit layer; and
a top coating layer disposed above the top center layer;
wherein:
the Young's modulus of both the bottom center layer and the top center layer is in the range of 2.5 kPa-4.5 kPa and the thickness of both the bottom center layer and the top center layer is in the range of 250 um-350 um;
the Young's modulus of both the bottom coating layer and the top coating layer is in the range of 50 kPa-70 kPa and the thickness of both the bottom coating layer and the top coating layer is in the range of 250 um-350 um;
the circuit layer comprises a device layer and a connection layer disposed above the device layer;
the device layer comprises a device matrix and alloy connection wires, the device matrix comprising a plurality of cells and a plurality of rechargeable batteries;
odd rows of the device matrix comprise a plurality of solar cells;
even rows of the device matrix comprise a plurality of rechargeable batteries;
the solar cells are composite semiconductor solar cells with thickness between 30 um-40 um;
the rechargeable batteries are lithium-ion chip cells y with thickness between 180 um-220 um;
the alloy connection wires are connected and conducting between the device layer and the connection layer, and made of indium silver alloy;
the connection layer comprises a connection wire network, the connection wire network comprising a plurality of connection wires and overlapping with the device matrix;
each device in the device matrix is connected to an adjacent device in the device matrix through the alloy connection wires and the connection wires of the connection network;
the connection wires essentially have a shape of sine waveforms; and
the connection layer comprises:
a first polyimide layer;
a copper layer disposed above the first polyimide layer; and
a second polyimide layer disposed above the copper layer.

2. A wearable power management system comprising:
a bottom coating layer;
a bottom center layer disposed above the bottom coating layer;
a circuit layer disposed above the bottom center layer;
a top center layer disposed above the circuit layer; and
a top coating layer disposed above the top center layer;
wherein:
the Young's modulus of both the bottom center layer and the top center layer is in the range of 2.5 kPa-4.5 kPa and the thickness of both the bottom center layer and the top center layer is in the range of 250 um-350 um;
the Young's modulus of the bottom coating layer and the top coating layer is greater than the Young's modulus of the bottom center layer and the top center layer;
the circuit layer comprises a device layer and a connection layer disposed above the device layer;
the device layer comprises a device matrix, the device matrix comprising a plurality of solar cells and a plurality of rechargeable batteries;
the connection layer comprises a connection wire network, the connection wire network comprising a plurality of connection wires and overlapping with the device matrix; and
each device in the device matrix is connected to an adjacent device in the device matrix through the connection wires of the connection network.

3. The wearable power management system of claim 2, wherein the Young's modulus of both the bottom coating layer and the top coating layer is in the range of 50 kPa-70 kPa and the thickness of both the bottom coating layer and the top coating layer is in the range of 250 um-350 um.

4. The wearable power management system of claim 2, wherein the device layer further comprises alloy connection wires connecting and conducting the device layer and the connection layer, and being made of indium silver alloy.

5. The wearable power management system of claim 2, wherein odd rows of the device matrix comprise a plurality of solar cells, while even rows of the device matrix comprise a plurality of rechargeable batteries.

6. The wearable power management system of claim 2, wherein the solar cells are composite semiconductor solar cells with thickness between 30 um-40 um, while the rechargeable batteries are lithium-ion chip cells with thickness between 180 um-220 um.

7. The wearable power management system of claim 2, wherein the connection wires essentially have a shape of sine waveforms.

8. The wearable power management system of claim 2, wherein the connection layer comprises:
    a first polyimide layer;
    a copper layer disposed above the first polyimide layer; and
    a second polyimide layer disposed above the copper layer.

9. A wearable power management system comprising:
    a bottom coating layer;
    a bottom center layer disposed above the bottom coating layer;
    a circuit layer disposed above the bottom center layer;
    a top center layer disposed above the circuit layer; and
    a top coating layer disposed above the top center layer; wherein:
    the Young's modulus of both the bottom coating layer and the top coating layer is in the range of 50 kPa-70 kPa and the thickness of both the bottom coating layer and the top coating layer is in the range of 250 um-350 um;
    the Young's modulus of the bottom coating layer and the top coating layer is greater than the Young's modulus of the bottom center layer and the top center layer; and
    the circuit layer comprises a device layer and a connection layer disposed above the device layer.

10. The wearable power management system of claim 9, wherein the device layer comprises a device matrix, the device matrix comprising a plurality of solar cells and a plurality of rechargeable batteries.

11. The wearable power management system of claim 10, wherein the connection layer comprises a connection wire network, the connection wire network comprising a plurality of connection wires and overlapping with the device matrix.

12. The wearable power management system of claim 11, wherein each device in the device matrix is connected to an adjacent device in the device matrix through the connection wires of the connection network; the Young's modulus of both the bottom center layer and the top center layer is in the range of 2.5 kPa-4.5 kPa and the thickness of both the bottom center layer and the top center layer is in the range of 250 um-350 um.

13. The wearable power management system of claim 9, wherein the device layer further comprises alloy connection wires connecting and conducting the device layer and the connection layer.

14. The wearable power management system of claim 10, wherein odd rows of the device matrix comprise a plurality of solar cells, while even rows of the device matrix comprise a plurality of rechargeable batteries.

15. The wearable power management system of claim 10, wherein the solar cells are composite semiconductor solar cells with thickness between 30 um-40 um, while the rechargeable batteries are lithium-ion chip cells with thickness between 180 um-220 um.

16. The wearable power management system of claim 11, wherein the connection wires essentially have a shape of sine waveforms.

17. The wearable power management system of claim 9, wherein the connection layer comprises:
    a first polyimide layer;
    a copper layer disposed above the first polyimide layer; and
    a second polyimide layer disposed above the copper layer.

18. The wearable power management system of claim 13, wherein the alloy connection wires are made of indium silver alloy.

19. The wearable power management system of claim 9, wherein the Young's modulus of both the bottom center layer and the top center layer is in the range of 2.5 kPa-4.5 kPa and the thickness of both the bottom center layer and the top center layer is in the range of 250 um-350 um.

* * * * *